United States Patent [19]
Dreps et al.

[11] Patent Number: 5,942,940
[45] Date of Patent: Aug. 24, 1999

[54] LOW VOLTAGE CMOS DIFFERENTIAL AMPLIFIER

[75] Inventors: Daniel Mark Dreps, Georgetown; Byron Lee Krauter; Robert Paul Masleid, both of Austin, all of Tex.

[73] Assignee: International Business Machines Corporation, Armonk, N.Y.

[21] Appl. No.: 08/897,476

[22] Filed: Jul. 21, 1997

[51] Int. Cl.$^6$ .................................................. H03F 3/45
[52] U.S. Cl. .......................................... 330/253; 307/530
[58] Field of Search .................................. 330/252, 253, 330/257; 307/530; 357/42

[56] References Cited

U.S. PATENT DOCUMENTS

| | | | |
|---|---|---|---|
| 3,991,380 | 11/1976 | Pryor | 330/253 |
| 4,300,061 | 11/1981 | Mihalich et al. | 307/297 |
| 4,303,958 | 12/1981 | Allgood | 361/100 |
| 4,769,564 | 9/1988 | Garde | 307/530 |
| 4,937,476 | 6/1990 | Bazes | 307/475 |
| 4,958,133 | 9/1990 | Bazes | 330/253 |
| 5,047,665 | 9/1991 | Burt | 307/355 |
| 5,065,055 | 11/1991 | Reed | 307/530 |
| 5,105,107 | 4/1992 | Wilcox | 307/475 |
| 5,212,455 | 5/1993 | Pernici et al. | 330/253 |
| 5,278,467 | 1/1994 | Nedwek | 307/530 |
| 5,420,539 | 5/1995 | Fensch | 330/253 |
| 5,451,902 | 9/1995 | Huang et al. | 330/253 |
| 5,463,348 | 10/1995 | Sarpeshkar et al. | 330/253 |
| 5,652,545 | 7/1997 | Miyashita et al. | 330/269 |
| 5,684,737 | 11/1997 | Wang et al. | 365/175 |
| 5,717,360 | 2/1998 | Vu et al. | 330/253 |

OTHER PUBLICATIONS

IEEE Journal of Solid–State Circuits, Mel Bazes, "Two Novel Fully Complementary Self–Biased CMOS Differential Amplifiers," vol. 26, No. 2, Feb. 1991.

*Primary Examiner*—Robert Pascal
*Assistant Examiner*—Khanh Van Nguyen
*Attorney, Agent, or Firm*—Anthony V.S. England; Jack V. Musgrove; Andrew J. Dillon

[57] ABSTRACT

A CMOS differential amplifier uses a first pair of complementary MOSFETs and a second pair of complementary MOSFETs coupled to a power supply (by another pair of MOSFETs) in such a manner as to be self-biasing and have improved channel-length modulation characteristics. An N-type MOSFET couples the first and second complementary MOSFET pairs to ground potential via a first resistor, and a P-type MOSFET couples the first and second complementary MOSFET pairs to a power-supply via a second resistor. The first and second resistors can be provided using non-salicided N-type MOSFET resistors. The third N-type MOSFET preferably has a low-threshold voltage, including a zero-threshold voltage, and the substrates of the P-type MOSFETs in the first and second complementary pairs are further preferably connected to the sources of those MOSFETs in order to reduce body-sensitivity effects.

6 Claims, 2 Drawing Sheets

LOW VOLTAGE CMOS DIFFERENTIAL AMPLIFIER

BACKGROUND OF THE INVENTION

1. Field of the Invention

The present invention generally relates to integrated semiconductor devices, such as metal-oxide semiconductors (MOS), and more particularly to a low-voltage complementary metal-oxide semiconducting (CMOS) differential amplifier.

2. Description of the Related Art

Logic circuits, such as those used in computer processors and other conventional microelectronics, depend upon electrical signals which are one of two voltage states, "high" or "low." The exact voltage of a high or low signal may vary considerably, and circuits are designed to be tolerant of margins about a nominal value. For example, conventional transistor-transistor-logic (TTL) logic levels use a voltage threshold of 1.4 volts, with a margin of 0.6 volts about the threshold, i.e., a high-voltage state can be as low as 2.0 volts, and a low-voltage state can be as high as 0.8 volts. In contrast, conventional circuitry using complementary metal-oxide semiconducting (CMOS) technology typically provides a voltage threshold between 2.0 and 3.0 volts. CMOS technology provides certain advantages over bipolar transistors, but the two types of transistors are often combined in a logic circuit. Thus, when using CMOS circuitry, it is necessary to translate voltage states from TTL logic levels to CMOS logic levels. Various types of buffers or amplifiers are used to couple such differing logic circuits and appropriately shift input voltage levels to be compatible with the output circuitry.

Prior-art logic level translators include both single-ended amplifiers and differential amplifiers. A single-ended amplifier simply has one input and one output, while a differential amplifier has two inputs and two outputs, the states of a given input or output pair being complementary, i.e., one being high and the other low. Differential amplifiers have several advantages over single-ended amplifiers and are commonly used to amplify analog, as well as digital, signals. Differential CMOS amplifiers can also be used as operational amplifiers, comparators, sense amplifiers and front-end buffers for other circuits, and are particularly useful for linear amplification with a minimum of distortion.

One CMOS differential amplifier is disclosed in U.S. Pat. No. 4,937,476, and is also discussed in the article "Two Novel Fully Complementary Self-Biased CMOS Differential Amplifiers," IEEE Journal of Solid-State Circuits, vol. 26, no. 2, pp. 165–68 (February 1991). A representative circuit constructed according to that invention is shown in FIG. 1, wherein an input buffer uses a self-biased differential amplifier. The differential amplifier has a first pair of complementary N- and P- type field effect transistors (FETs) coupled to the input signal ($V_{IN+}$), and a second pair of complementary N- and P- type FETs coupled to a reference voltage ($V_{IN-}$). The first and second pairs of FETs are coupled to a supply voltage ($V_{dd}$) that is controlled by a third pair of complementary FETs. The drains of the first set of FETs are connected to the gates of the third set of FETs, to create a negative feedback within the amplifier. The bias voltage of the first set FETs is set at the midpoint of the active region. If the bias voltage moves from the midpoint (e.g., due to variations in temperature), the feedback from the first FETs to the third FETs will vary the supply voltage so that the bias voltage is returned to the center of the active region. This circuit has a single output; for a time differential output, the circuit is duplicated with the input signals cross-wired, providing two outputs. See also U.S. Pat. Nos. 4,958,133 and 5,278,467.

The foregoing design still has certain limitations. Typical high- or low-threshold voltage ($V_t$) devices have relatively narrow channel-length modulation characteristics and, accordingly, analog current sources have limited common-mode power supply rejection ratios (CMRR). Delay variations can also occur due to the NFET and PFET impedance ranges. PFETs, as configured in the prior-art, can further exhibit undesirable body-effect sensitivity arising from voltage variations in the FET substrate. Rise time signal quality is relatively quick in these devices, but there is still room for improvement with lower power supplies, i.e., rise time can be slower where power is supplied via a battery. It would, therefore, be desirable and advantageous to devise a CMOS differential amplifier which would overcome the foregoing limitations.

SUMMARY OF THE INVENTION

It is therefore one object of the present invention to provide a CMOS differential amplifier.

It is another object of the present invention to provide such a CMOS differential amplifier which has improved operating characteristics such as channel-length modulation and common-mode power supply rejection ratios.

It is yet another object of the present invention to provide a CMOS differential power supply that is particularly suited for low-voltage applications.

The foregoing objects are achieved in a CMOS differential amplifier generally comprising a first N-type MOSFET and a first P-type MOSFET (forming a first pair of complementary MOSFETs), the drain of the first P-type MOSFET being connected to the drain of the first N-type MOSFET, and the gate of the first P-type MOSFET being connected to the gate of the first N-type MOSFET to provide a first input, a second N-type MOSFET and a second P-type MOSFET (forming a second pair of complementary MOSFETs), the drain of the second P-type MOSFET being connected to the drain of the second N-type MOSFET to provide an output, and the gate of the second P-type MOSFET being connected to the gate of the second N-type MOSFET to provide a second input, the first and second complementary pairs of MOSFETs being coupled to a power supply which is controlled by a third N-type MOSFET and a third P-type MOSFET to provide feedback, the source of the third N-type MOSFET being coupled to ground potential via a first resistor, and the source of the third P-type MOSFET being coupled to a power supply via a second resistor. The first and second resistors can be provided using non-salicided N-type MOSFET resistors. The third N-type MOSFET preferably has a low-threshold voltage, including a zero-threshold voltage. The substrates of the first and second P-type MOSFETs further, preferably, are connected to the sources of those MOSFETS. The resulting differential amplifier not only has good gain characteristics and is self-biasing, but further exhibits improved channel-length modulation characteristics, more limited delay variation, and can operate more efficiently with low-power supplies, such as batteries.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DESCRIPTION OF THE PREFERRED EMBODIMENT

Figure 2:
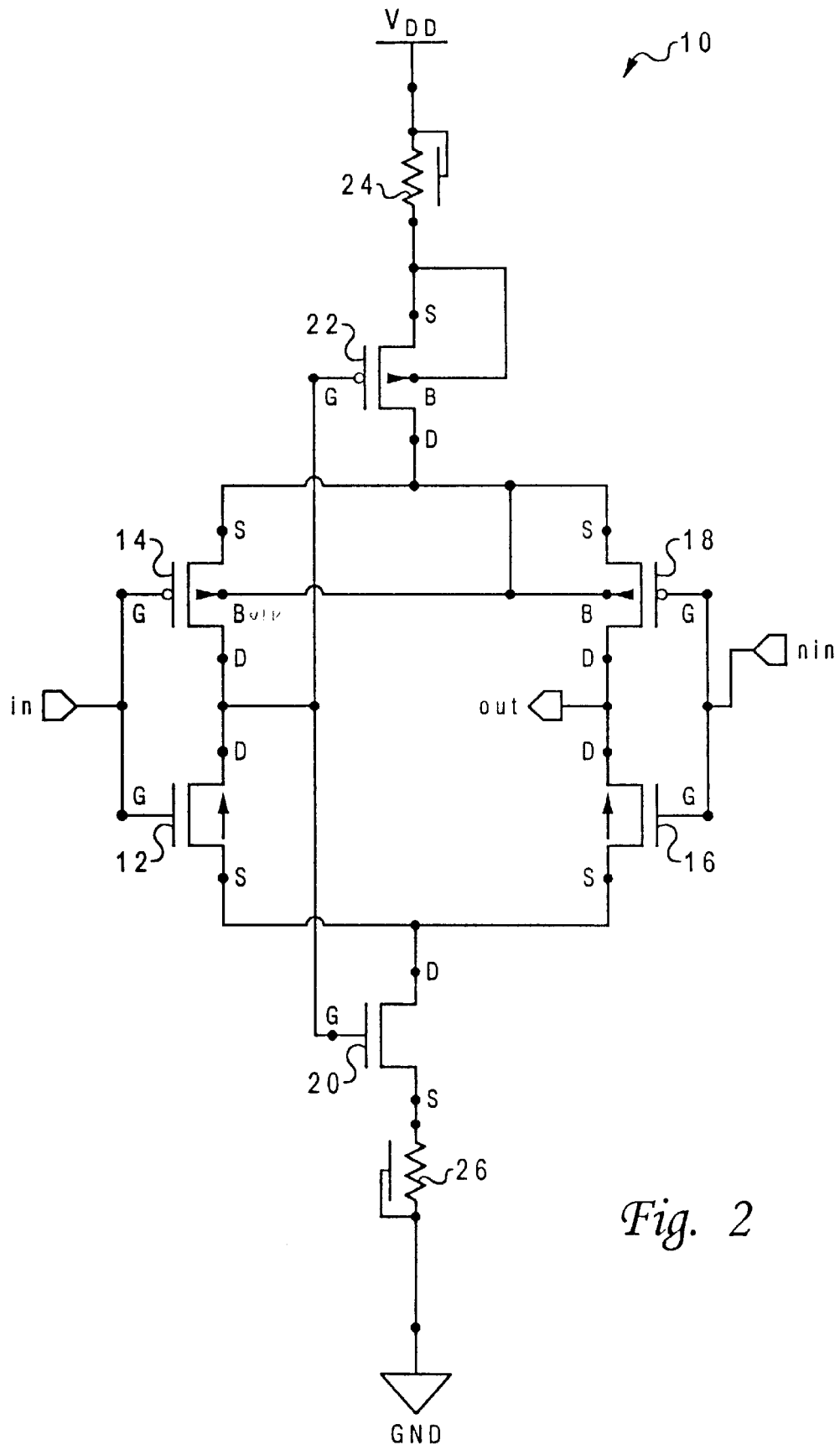
FIG. 2 is a schematic diagram of one embodiment of a CMOS differential amplifier constructed in accordance with the present invention.

With reference now to FIG. 2, there is depicted one embodiment of the complementary metal-oxide semiconducting (CMOS) differential amplifier 10 of the present invention. Differential amplifier 10 contains several metal-oxide semiconducting field-effect transistors (MOSFETs), including an N-type MOSFET 12 and a P-type MOSFET 14 forming a first pair of complementary MOSFETs, another N-type MOSFET 16 and another P-type MOSFET 18 forming a second pair of complementary MOSFETs, and a third N-type MOSFET 20 and a third P-type MOSFET 22. The first pair of complementary MOSFETs 12 and 14 are coupled to an input voltage, i.e., the input signal is connected to the gates of those MOSFETs, and the drain of P-type MOSFET 14 is connected to the drain of N-type MOSFET 12. The second pair of complementary MOSFETs 16 and 18 are coupled to a reference voltage, i.e., the reference signal is connected to the gates of those MOSFETs, and the drain of P-type MOSFET 18 is similarly connected to the drain of N-type MOSFET 16.

The source of P-type MOSFET 22 is connected to a supply voltage ($V_{dd}$) via a non-salicided N-type MOSFET resistor 24. The sources of P-type MOSFETs 14 and 18, which are connected together and to the drain of P-type MOSFET 22, are also connected to the substrates (bodies) of P-type MOSFETs 14 and 18. The body of P-type MOSFET 22 is similarly connected to its source.

The gate of P-type MOSFET 22 is connected to the drain of P-type MOSFET 14 and to the drain of N-type MOSFET 12, and also connected to the gate of N-type MOSFET 20, providing negative feedback. The drain of N-type MOSFET 20 is connected to the sources of the other two N-type MOSFETs 12 and 16, while the source of N-type MOSFET 20 is connected to ground via another non-salicided N-type MOSFET resistor 26. The source of P-type MOSFET 18 and the drain of N-type MOSFET 16 are connected together to provide the single output of differential amplifier 10. For a true differential output, the entire circuit shown in FIG. 2 is duplicated with the input signals cross-wired, to provide a second output signal.

Figure 1:
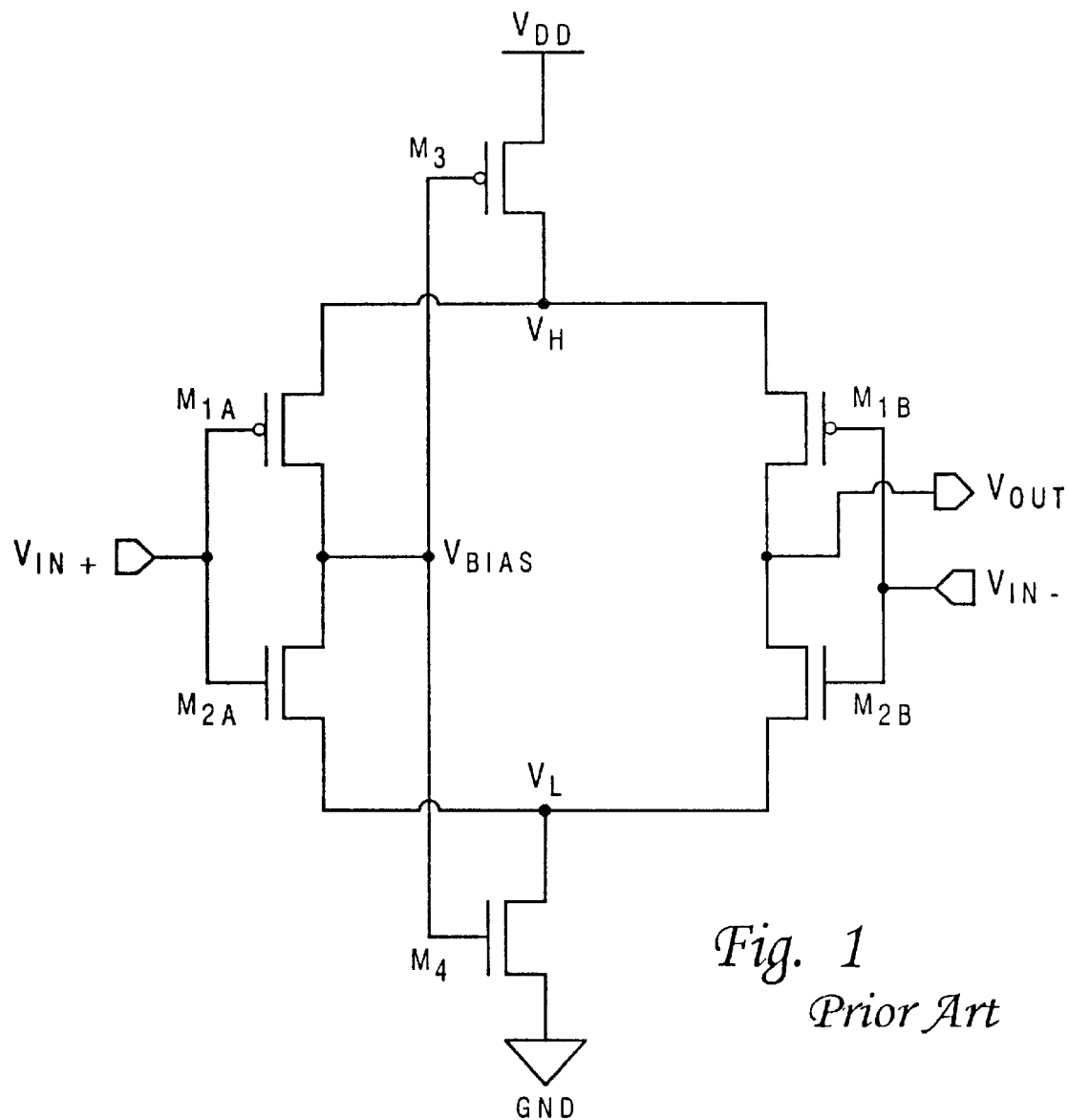
FIG. 1 is a schematic diagram of a prior-art, self-biasing CMOS differential amplifier.

As with the prior-art differential amplifier shown in FIG. 1, differential amplifier 10 exhibits relatively high gain and is self-biasing. Differential amplifier 10 has several other advantages, however, which the prior-art device does not possess. For example, the present invention preferably uses a zero $V_t$ device for N-type MOSFET 20, which results in better channel-length modulation characteristics than either the typical high or low $V_t$ device. Therefore, analog current sources for differential circuits have better common-mode power supply rejection ratios (CMRRs). Also, the relative sizes of the MOSFET devices used in the amplifier are scalable based on whether optimization is desired with respect to switching threshold or load. Thus, while device 20 can be a zero $V_t$ MOSFET, it could alternatively be a low $V_t$ N-type MOSFET (e.g., $V_t$<100 millivolts). The other MOSFET devices used in differential amplifier 10 can also have a low or zero $V_t$, but zero threshold devices require relatively large areas; that is, there is a tradeoff between improved performance and area. Therefore, N-type MOSFET 20 is preferably selected as the sole zero threshold device because it achieves an optimal effect.

Another advantage relates to the uses of the non-salicided N-type MOSFET drain resistances 24 and 26. These resistors are designed by blocking the salicide mask of the MOSFET drain region. The resulting diffusion sheet resistivity (rho) lies in between the salicided diffusion and the normal Nwell in relative terms. These types of resistors are usually in the 50–100 ohm/square range, and are particularly useful in I/O circuits for impedance control and slew-rate range limitation. In the embodiment of FIG. 2, they act to limit delay variations in the output signal because the variation in the resistance of the resistors is much less than the normal N- and P-type MOSFET impedance ranges. In particular, the combination of the relatively large resistance of the non-salicided resistors and their relatively low manufacturing tolerance results in the resistors essentially controlling the voltage. The use of non-salicided resistors does not require any extra process steps, but rather only requires an extra mask in one of the conventional process steps.

Another performance improvement is achieved by tying the bulk of the P-type MOSFETs to their respective sources. This configuration eliminates the body-effect sensitivity of those MOSFETS, the result being tighter delay tolerance for the same physical MOSFET dimensions. Also, since the zero $V_t$ N-type MOSFET 20 allows the drain of N-type MOSFET 12 to swing down to a lower level, i.e., closer to ground potential (that level is a function of the threshold of device 20), the pre-bias of the node (drain) of P-type MOSFET 22 creates more absolute voltage overdrive (there is more absolute voltage between $V_{dd}$ and the gate of P-type MOSFET 22 when charging the node). Therefore, the effective width of the device is larger, causing a faster rise time of the output node of the circuit. Another way to view this characteristic is that the capacitance on the common P-type MOSFET node lowers in absolute value or is effectively eliminated. By using a zero $V_t$ N-type MOSFET, the rise time signal quality exists for lower-power supplies, which means faster speed for battery applications. The disclosed circuit makes it feasible to use power-supply voltages of as low as 1.5 volts.

This embodiment of the differential amplifier of the present invention is particularly useful to de-skew differential clock lines. It can also be used to convert differential voltage swings that are less than the supply voltage to swings that are equal to the normal CMOS swing (which is $V_{dd}$).

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

We claim:

1. A CMOS differential amplifier comprising:
   a first N-type MOSFET having a gate, a drain, and a source;
   a first P-type MOSFET having a gate, a drain, and a source, said drain of said first P-type MOSFET being connected to said drain of said first N-type MOSFET, and said gate of said first P-type MOSFET being connected to said gate of said first N-type MOSFET to provide a first input;

a second N-type MOSFET having a gate, a drain, and a source;

a second P-type MOSFET having a gate, a drain, and a source, said drain of said second P-type MOSFET being connected to said drain of said second N-type MOSFET to provide an output, and said gate of said second P-type MOSFET being connected to said gate of said second N-type MOSFET to provide a second input;

a third N-type MOSFET having a gate, a drain, and a source, said drain of said third N-type MOSFET being connected to said sources of said first and second N-type MOSFETs, and said source of said third N-type MOSFET being coupled to ground potential via a first non-salicided resistor having a resistivity in the range of 50–100 ohm/square; and a third P-type MOSFET having a gate, a drain, and a source, said drain of said third P-type MOSFET being connected to said sources of said first and second P-type MOSFETs, said source of said third P-type MOSFET being coupled to a power supply via a second non-salicided resistor having a resistivity in the range of 50–100 ohm/square, and said gates of said third P-type MOSFET and said third N-type MOSFET being connected to said drain of said first N-type MOSFET and said drain of said first P-type MOSFET.

2. The CMOS differential amplifier of claim 1 wherein said third N-type MOSFET has a low-threshold voltage.

3. The CMOS differential amplifier of claim 1 wherein said third N-type MOSFET has a zero-threshold voltage.

4. The CMOS differential amplifier of claim 1 wherein said first and second P-type MOSFETs each have a substrate, and said substrates are connected to said sources of said first and second P-type MOSFETs.

5. The CMOS differential amplifier of claim 4 wherein said third P-type MOSFET also has a substrate, and said substrate of said third P-type MOSFET is connected to said source of said third P-type MOSFET.

6. A differential amplifier comprising:

a plurality of MOSFETs, including first and second p-type MOSFETs interconnected to amplify a difference between first and second input signals, and further including an n-type MOSFET coupling said first and second p-type MOSFETs to ground, wherein said first and second p-type MOSFETs each have source, drain and gate electrodes and a substrate, said substrates being connected to said source electrodes, and wherein said n-type MOSFET is an essentially zero threshold voltage MOSFET; and first and second non-salicided resistors coupled in series with said MOSFETs.

* * * * *